(12) United States Patent
Lin et al.

(10) Patent No.: US 12,432,946 B2
(45) Date of Patent: Sep. 30, 2025

(54) MIM CAPACITOR STRUCTURE AND FABRICATING METHOD OF THE SAME

(71) Applicant: UNITED MICROELECTRONICS CORP., Hsin-Chu (TW)

(72) Inventors: Da-Jun Lin, Kaohsiung (TW); Bin-Siang Tsai, Changhua County (TW); Fu-Yu Tsai, Tainan (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 408 days.

(21) Appl. No.: 18/107,521

(22) Filed: Feb. 9, 2023

(65) Prior Publication Data
US 2024/0213304 A1 Jun. 27, 2024

(30) Foreign Application Priority Data

Dec. 21, 2022 (CN) .......................... 202211649778.6

(51) Int. Cl.
| | | |
|---|---|---|
| *H10D 1/68* | (2025.01) | |
| *H01L 21/285* | (2006.01) | |
| *H01L 21/768* | (2006.01) | |
| *H01L 23/522* | (2006.01) | |
| *H01L 23/532* | (2006.01) | |
| *H10D 84/60* | (2025.01) | |
| *H10D 84/80* | (2025.01) | |

(52) U.S. Cl.
CPC ....... *H10D 1/692* (2025.01); *H01L 21/28556* (2013.01); *H01L 21/76843* (2013.01); *H01L 21/76877* (2013.01); *H01L 23/5226* (2013.01); *H01L 23/53228* (2013.01); *H01L 23/53295* (2013.01); *H10D 84/611* (2025.01); *H10D 84/811* (2025.01)

(58) Field of Classification Search
CPC ......... H01L 21/76898; H01L 21/28556; H01L 21/76843; H01L 21/76877; H01L 23/481; H01L 23/5226; H01L 23/53228; H10D 1/68; H10D 1/692
See application file for complete search history.

(56) References Cited

U.S. PATENT DOCUMENTS

| | | | | |
|---|---|---|---|---|
| 6,528,366 B1 * | 3/2003 | Tu | .......................... | H10D 1/716 438/386 |
| 7,378,719 B2 * | 5/2008 | Yang | ...................... | H10D 1/716 257/532 |
| 8,487,405 B2 | 7/2013 | Tian | | |
| 8,841,200 B2 | 9/2014 | Cheng | | |
| 9,653,534 B2 | 5/2017 | Ando | | |

(Continued)

*Primary Examiner* — Zandra V Smith
*Assistant Examiner* — John M Parker
(74) *Attorney, Agent, or Firm* — Winston Hsu

(57) ABSTRACT

An MIM capacitor structure includes numerous inter-metal dielectrics. A trench is embedded within the inter-metal dielectrics. A capacitor is disposed within the trench. The capacitor includes a first electrode layer, a capacitor dielectric layer and a second electrode layer. The first electrode layer, the capacitor dielectric layer and the second electrode layer fill in and surround the trench. The capacitor dielectric layer is between the first electrode layer and the second electrode layer. A silicon oxide liner surrounds a sidewall of the trench and contacts the first electrode layer.

4 Claims, 6 Drawing Sheets

(56) References Cited

U.S. PATENT DOCUMENTS

| | | | |
|---|---|---|---|
| 11,735,498 B2* | 8/2023 | Park | H01L 21/76898 257/508 |
| 2012/0094437 A1* | 4/2012 | Han | H01L 21/76831 257/E21.585 |
| 2012/0276736 A1* | 11/2012 | Idani | H01L 21/76898 438/642 |
| 2013/0069199 A1* | 3/2013 | Adkisson | H10D 1/716 257/532 |
| 2021/0265241 A1* | 8/2021 | Wang | H01L 23/564 |
| 2022/0165739 A1* | 5/2022 | Mun | H10B 41/10 |
| 2022/0223433 A1* | 7/2022 | Lo | H01L 25/50 |
| 2022/0359346 A1* | 11/2022 | Wang | H01L 23/481 |

* cited by examiner

MIM CAPACITOR STRUCTURE AND FABRICATING METHOD OF THE SAME

BACKGROUND OF THE INVENTION

1. Field of the Invention

The present invention relates to a metal-insulator-metal (MIM) capacitor structure, and more particularly to a capacitor structure which includes a capacitor disposed within inter-metal dielectrics.

2. Description of the Prior Art

Various capacitor structures are applied in the integrated circuits, such as metal oxide semiconductor capacitors, p-n junction capacitors, and metal-insulator-metal (MIM) capacitors. MIM capacitors have advantages over metal oxide semiconductor capacitors and p-n junction capacitors. For example, MIM capacitors have a lower resistance and the fabricating process of MIM capacitors is compatible with the fabricating process of integrated circuit. Therefore, MIM capacitors become major capacitors used in integrated circuits. In order to increase chip efficiency, the stability and performance of MIM capacitors need to be improved.

SUMMARY OF THE INVENTION

In view of this, the present invention provides an MIM capacitor structure and a fabricating method of the MIM capacitor to improve performance of MIM capacitors.

According to a preferred embodiment of the present invention, an MIM capacitor structure includes numerous inter-metal dielectrics. A trench is embedded within numerous inter-metal dielectrics. A capacitor is disposed within the trench, wherein the capacitor includes a first electrode layer, a capacitor dielectric layer and a second electrode layer, the first electrode layer, the capacitor dielectric layer and the second electrode layer fill in and surround the trench, and the capacitor dielectric layer is between the first electrode layer and the second electrode layer.

According to a preferred embodiment of the present invention, an MIM capacitor structure includes a capacitor. The capacitor includes a first electrode layer, a capacitor dielectric layer and a second electrode layer, wherein the capacitor dielectric layer is disposed between the first electrode layer and the second electrode layer. A silicon oxide liner surrounds and contacts the first electrode layer. A copper material layer contacts the second electrode layer.

According to a preferred embodiment of the present invention, a fabricating method of an MIM capacitor structure includes providing numerous inter-metal dielectrics. Next, a trench is formed to embed within the inter-metal dielectrics. Thereafter, a flowable chemical vapor deposition is performed to form a silicon oxide liner covering and contacting the trench and covering and contacting a topmost surface of the inter-metal dielectrics. Finally, a first electrode layer, a capacitor dielectric layer, a second electrode layer and a copper material layer are formed to fill into the trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a fabricating method of an MIM capacitor structure according to a preferred embodiment of the present invention, wherein:

FIG. 1 shows numerous inter-metal dielectrics with copper dual damascene structures therein;

FIG. 2 is a fabricating stage in continuous from FIG. 1;
FIG. 3 is a fabricating stage in continuous from FIG. 2;
FIG. 4 is a fabricating stage in continuous from FIG. 3;
FIG. 5 is a fabricating stage in continuous from FIG. 4;
FIG. 6 is a fabricating stage in continuous from FIG. 5;
FIG. 7 is a fabricating stage in continuous from FIG. 6;
and
FIG. 8 is a fabricating stage in continuous from FIG. 7.

DETAILED DESCRIPTION

FIG. 1 to FIG. 8 depict a fabricating method of an MIM capacitor structure according to a preferred embodiment of the present invention.

Figure 1:
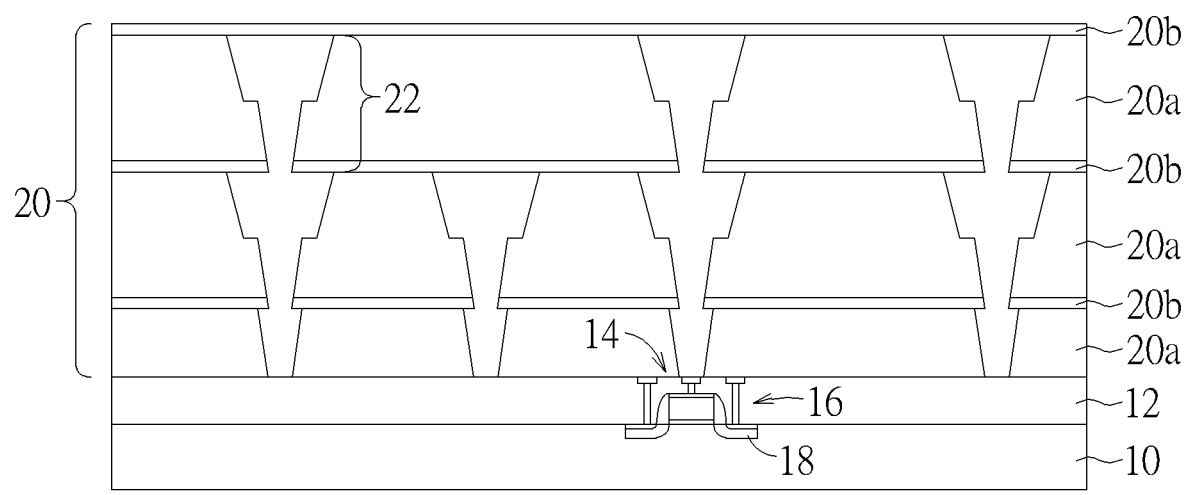

As show in FIG. 1, a semiconductive substrate 10 is provided. The semiconductive substrate 10 includes a bulk silicon substrate, a germanium substrate, a gallium arsenide substrate, a silicon germanium substrate, an indium phosphide substrate, a gallium nitride substrate or a silicon carbide substrate. A transistor 14 is disposed on the semiconductive substrate 10. A dielectric layer 12 covers the semiconductive substrate 10. A plug 16 is disposed within the dielectric layer 12. The plug 16 contacts a source/drain doped region 18 of the transistor 14. The dielectric layer 12 and the transistor 14 are fabricated by a front end of line process (FEOL). Numerous inter-metal dielectrics 20 cover the dielectric layer 12. The inter-metal dielectrics 20 include a dielectric layer 20a and a stop layer 20b stacked alternately. Preferably, the inter-metal dielectrics 20 consist of a dielectric layer 20a and a stop layer 20b stacked alternately. The transistor 14 does not contact the inter-metal dielectrics 20. Besides, numerous copper dual damascene structures 22 are embedded within the inter-metal dielectrics 20. The inter-metal dielectrics 20 and the copper dual damascene structures 22 are manufactured by a back end of line (BEOL)

Figure 2:
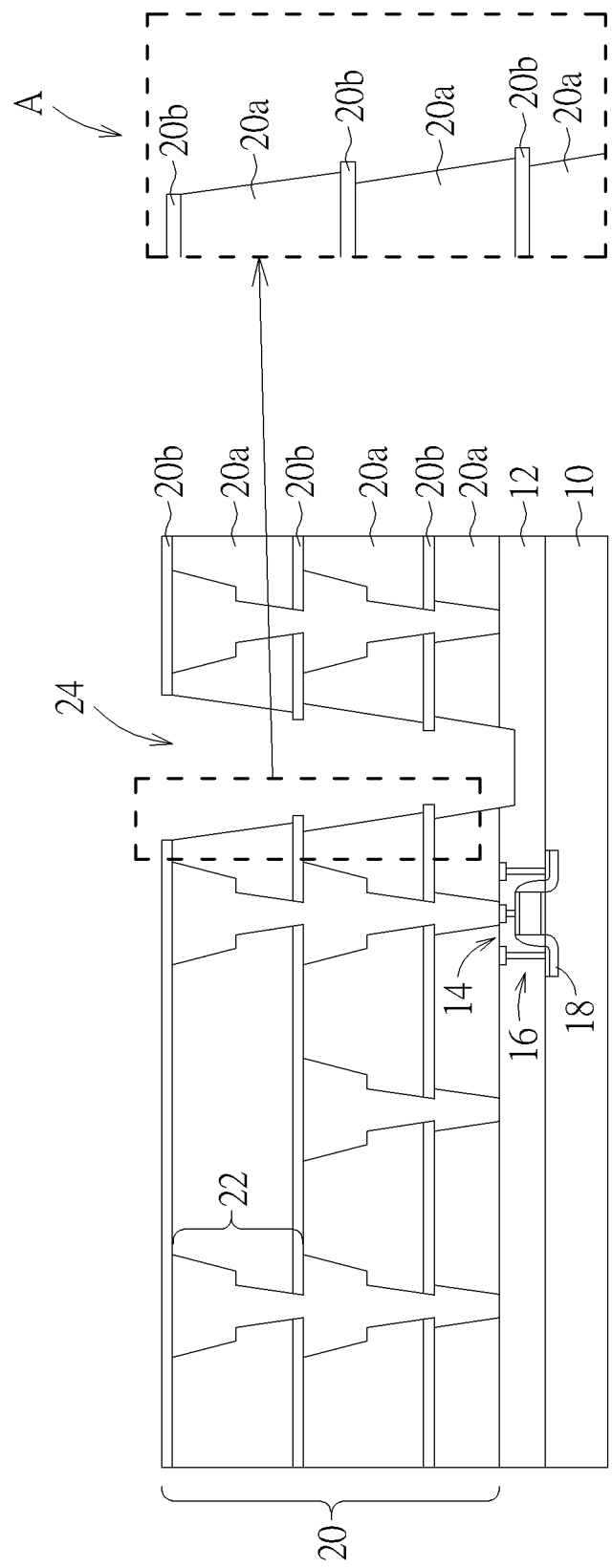

As shown in FIG. 2, a trench 24 is formed to embed into the inter-metal dielectrics 20. The trench 24 can be formed by dry etching the inter-metal dielectrics 20 such as dry etching the dielectric layer 20a and the stop layer 20b. Because materials of the dielectric layer 20a and the stop layer 20b are different, the etching rates of the dielectric layer 20a and the stop layer 20b are also different during the dry etching. In this embodiment, the etching rate of the stop layer 20b is smaller than the etching rate of the dielectric layer 20a. This leads to an uneven sidewall of the trench 24. To show the surface of the sidewall of the trench 24 clearly, the region framed by dashed lines are magnified at the right side in FIG. 2. As shown in the enlarged view A, the end of the stop layer 20b protrudes from the end of the dielectric layer 20a; therefore, the surface of the sidewall of the trench 24 is not even.

Figure 3:
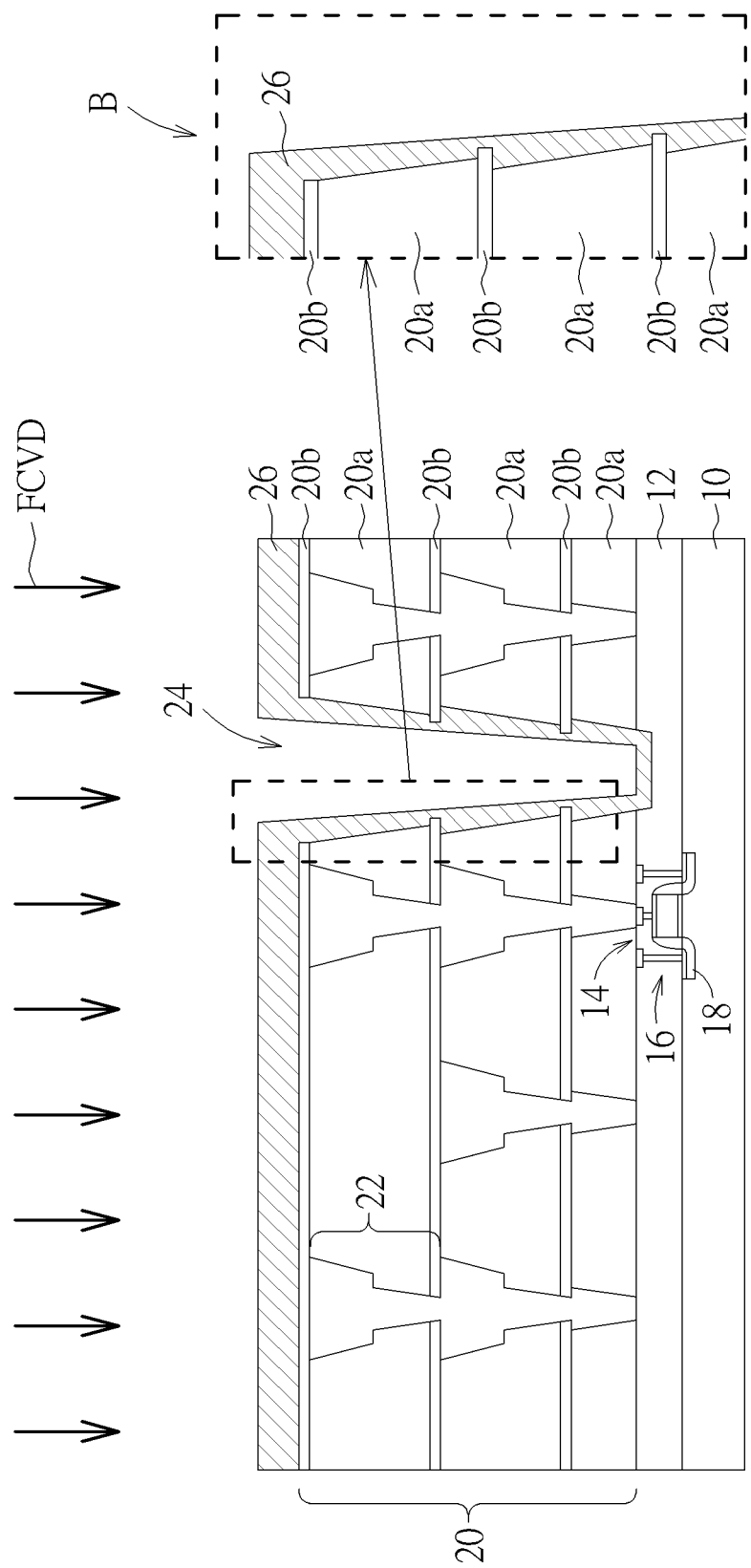

As shown in FIG. 3, a flowable chemical vapor deposition FCVD is performed to form a silicon oxide liner 26 to cover and contact the trench 24 and the topmost surface of the inter-metal dielectrics 20. To show the surface of the sidewall of the trench 24 and the surface of the silicon oxide liner 26 clearly, the region framed by dashed lines is magnified at the right side in FIG. 3. As shown in the enlarged view B, the silicon oxide liner 26 formed by the flowable chemical vapor deposition FCVD can conformally cover the sidewall of the trench 24; therefore the uneven surface of the sidewall of the trench 24 is filled up by the silicon oxide liner 26 and the silicon oxide liner 26 provides an even surface. An operating temperature of the flowable chemical vapor deposition FCVD is between 150 degrees Celsius and 200 degrees Celsius which will not cause copper atoms to diffuse.

Figure 4:
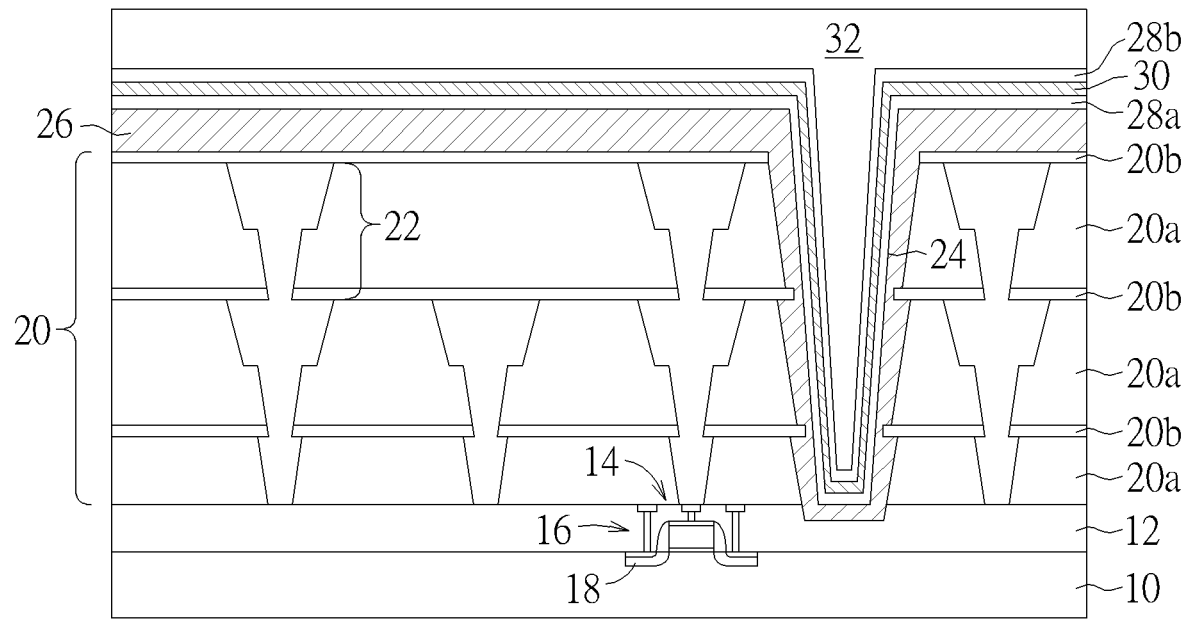

As shown in FIG. 4, a first electrode layer 28a, a capacitor dielectric layer 30 and a second electrode layer 28b are formed in sequence to conformally fill in the trench 24 and cover the topmost surface of the inter-metal dielectrics 20. The first electrode layer 28a and the second electrode layer 28b include TiN, Ti, Ta, Al or other metals. The capacitor dielectric layer 30 includes an oxide-nitride-oxide (ONO) stacked layer, a high-K dielectric or other insulating materials. The first electrode layer 28a, the capacitor dielectric layer 30 and the second electrode layer 28b can be formed by deposition processes. Next, a copper material layer 32 is formed in the trench 24 and covers the topmost surface of the inter-metal dielectrics 20. The copper material layer 32 contacts the second electrode layer 28b. The copper material layer 32 is preferably formed by an electroplating process.

Figure 5:
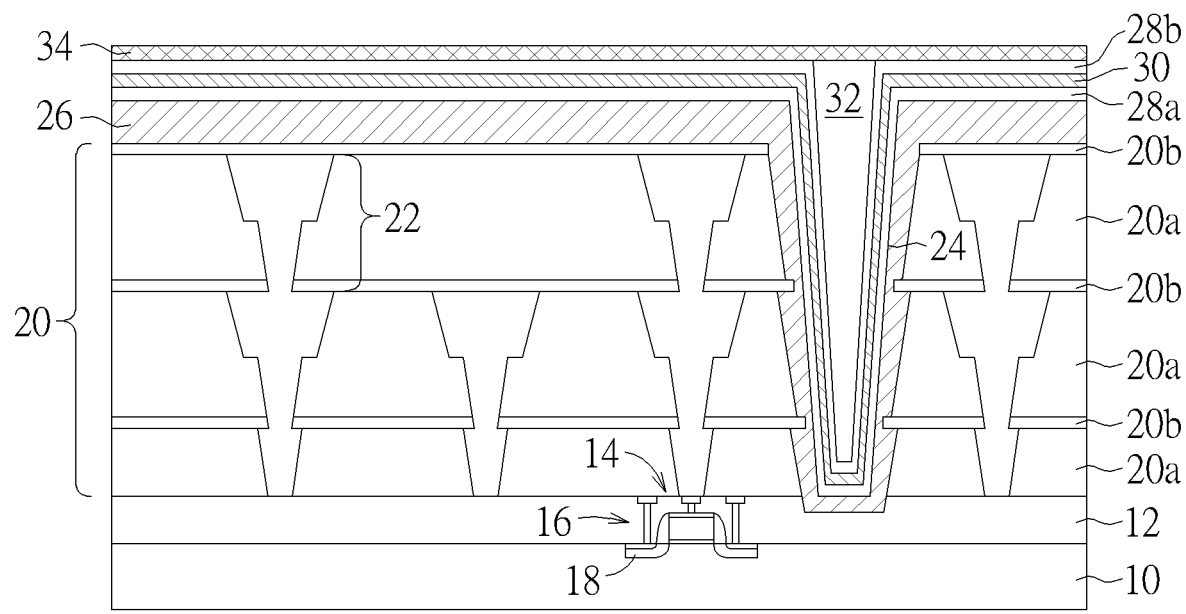

As shown in FIG. 5, a planarization process is performed to remove the copper material layer 32 and expose the second electrode layer 28b. Then, a first silicon nitride layer 34 is formed to cover the second electrode layer 28b and the copper material layer 32. The first silicon nitride layer 34 contacts the copper material layer 32. The first silicon nitride layer 34 covers the copper material layer 32 and prevents the copper material layer 32 from exposure. In this way, the copper atoms in the copper material layer 32 can be kept from diffusing to other regions.

Figure 6:
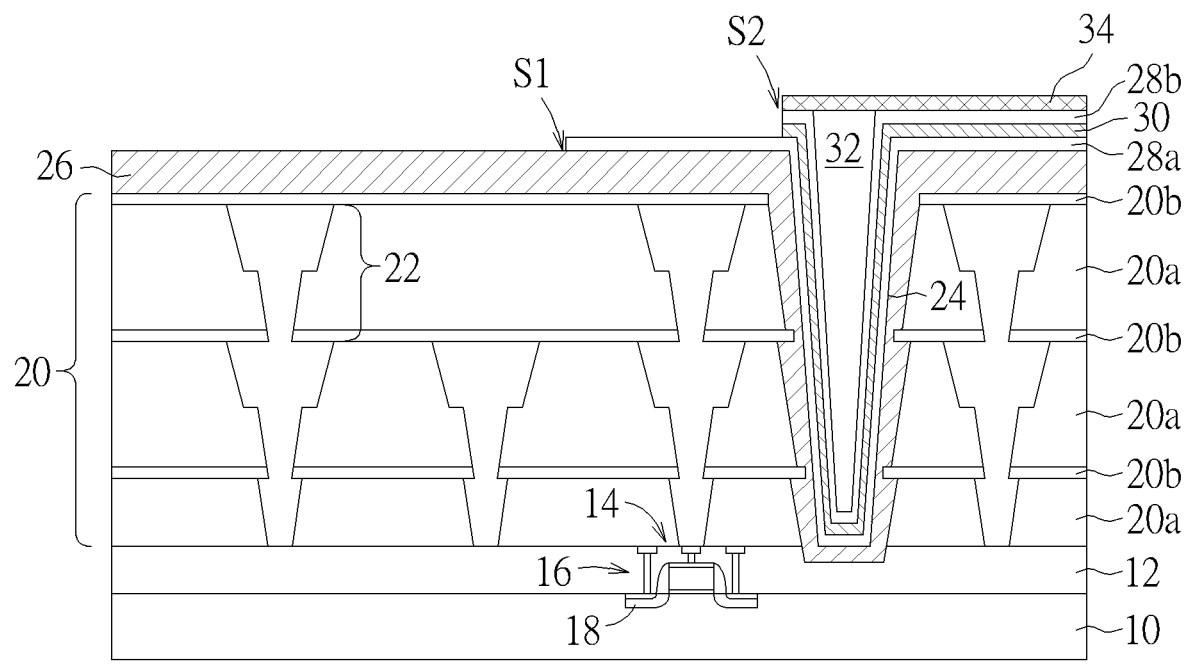
Figure 7:
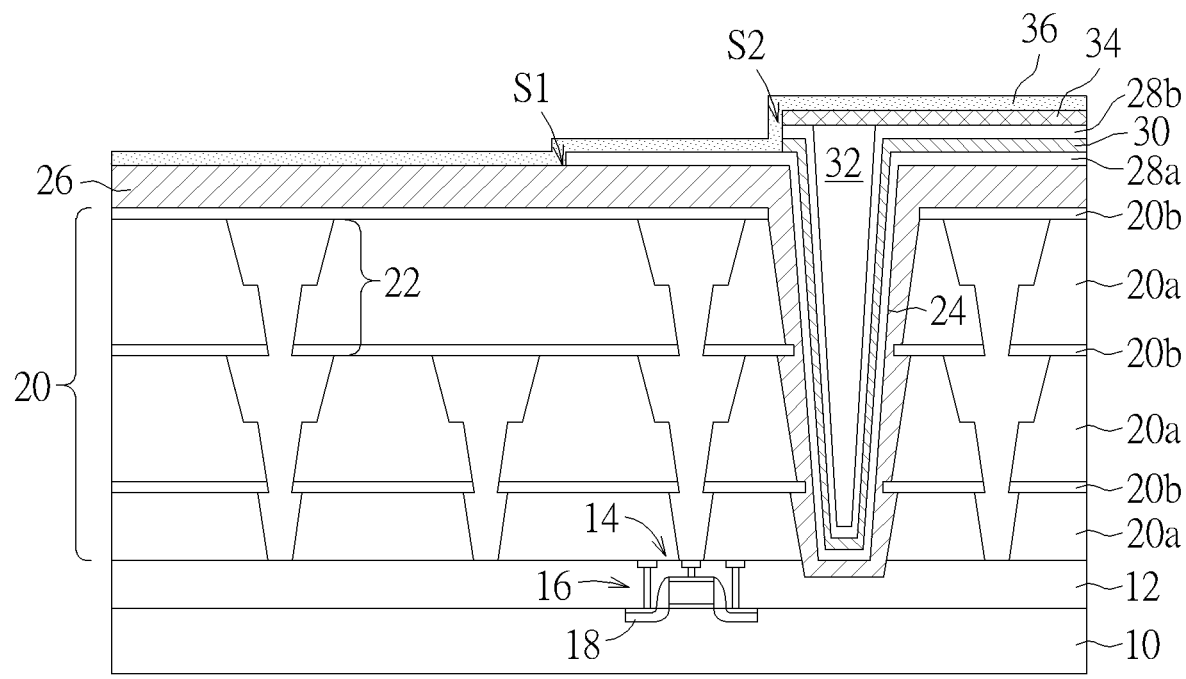

As shown in FIG. 6, the first electrode layer 28a, the capacitor dielectric layer 30 and the second electrode layer 28b are patterned to expose the first electrode layer 28a and the silicon oxide liner 26. The silicon oxide liner 26 and the first electrode layer 28a form a step profile S1. The first electrode layer 28a and the first silicon nitride layer 34 form another step profile S2. As shown in FIG. 7, a second silicon nitride layer 36 is formed to cover the silicon oxide liner 26, the first electrode layer 28a and the first silicon nitride layer 34.

Figure 8:
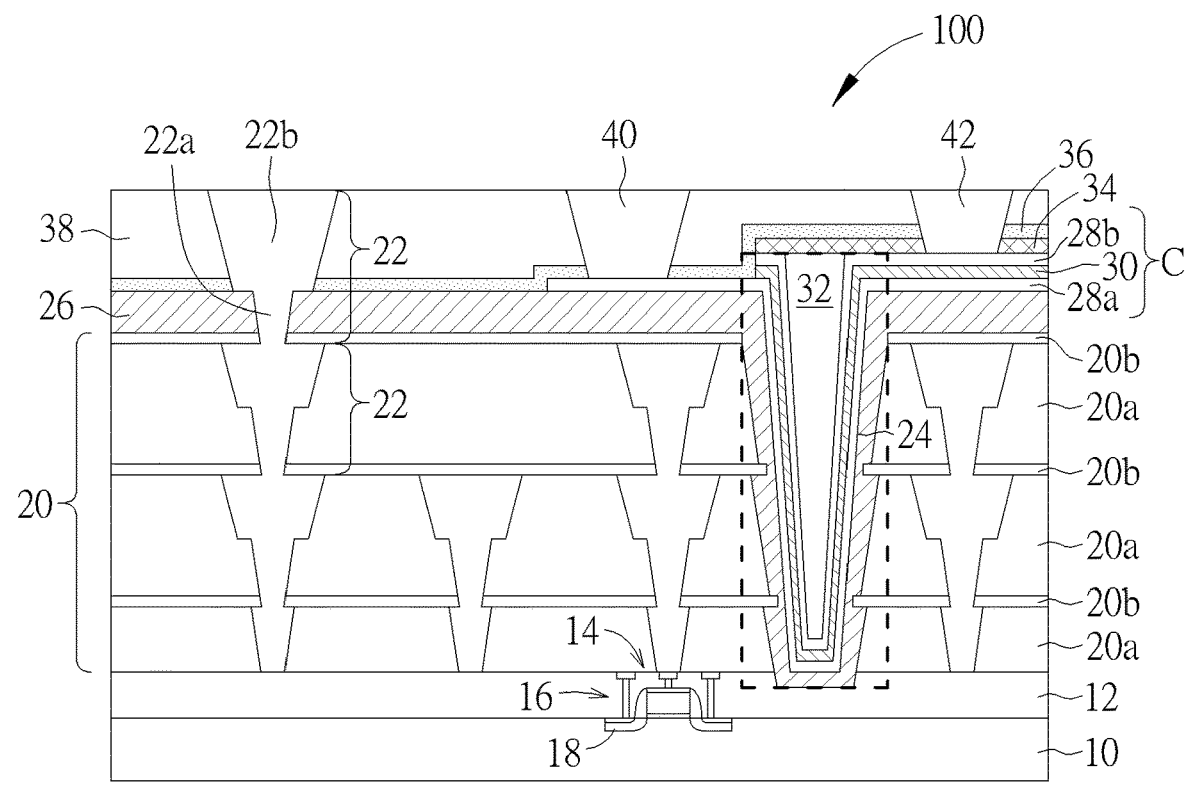

As shown in FIG. 8, a dielectric layer 38 such as a silicon nitride layer is formed to cover the second silicon nitride layer 36. Next, at least one via hole and at least one trench of a dual damascene structure are formed in the first silicon nitride layer 34, the second silicon nitride layer 36 and the dielectric layer 38. The via hole is within the silicon oxide liner 26. The trench is in the dielectric layer 38 and the second silicon nitride layer 36 or in the dielectric layer 38, the second silicon nitride layer 36 and the first silicon nitride layer 34. After that, copper is formed to fill in the dual damascene structure. In this way, a copper dual damascene structure 22 is formed. The via 22a of the copper dual damascene structure 22 is embedded within the silicon oxide liner 26. The conductive line 22b of the copper dual damascene structure 22 is within the dielectric layer 38 and the second silicon nitride layer 36. A first electrode plug 40 and a second electrode plug 42 are formed in the dielectric layer 38, the second silicon nitride layer 36 and the first silicon nitride layer 34 after the formation of copper. The first electrode plug 40 penetrates the dielectric layer 28 and the second silicon nitride layer 36, and contacts the first electrode layer 28a. The second electrode plug 42 penetrates the dielectric layer 38, the second silicon nitride layer 36 and the first silicon nitride layer 34, and contacts the second electrode layer 28b. The conductive line 22b of the copper dual damascene structure 22 penetrates the dielectric layer 38 and the second silicon nitride layer 36, and contacts the via 22a of the copper dual damascene structure 22. Now an MIM capacitor structure 100 of the present invention is completed.

As shown in FIG. 8, an MIM capacitor structure 100 includes numerous inter-metal dielectrics 20. A trench 24 is embedded within the inter-metal dielectrics 20. A capacitor C is disposed within the trench 24. The capacitor C includes a first electrode layer 28a, a capacitor dielectric layer 30 and a second electrode layer 28b fill in and surround the trench 24. The capacitor dielectric layer 30 is between the first electrode layer 28a and the second electrode layer 28b. A silicon oxide liner 26 fills in the trench 24 and surrounds and contacts the sidewall of the trench 24. Moreover, the silicon oxide liner 26 surrounds and contacts the first electrode layer 28a. A copper material layer 32 fills in the trench 24 and contacts the second electrode layer 28b.

Figure 9:
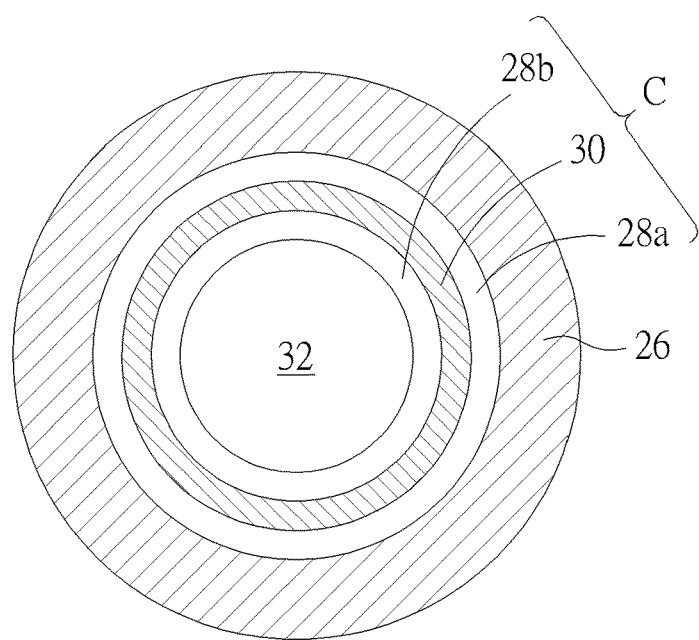
FIG. 9 depicts a top view of a region which is framed by dashed lines in FIG. 8.

FIG. 9 depicts a top view of a region which is framed by dashed lines in FIG. 8. To show the respective positions of the first electrode layer 28a, the capacitor dielectric layer 30, the second electrode layer 28b and the silicon oxide liner 26 clearly, the first silicon nitride layer 34 and the second silicon nitride layer 36 are omitted.

As shown in FIG. 9, the silicon oxide liner 26, the first electrode layer 28a, the capacitor dielectric layer 30, the second electrode layer 28b and the copper material layer 32 form a concentric circle. The copper material layer 32 is the center of concentric circle. The silicon oxide liner 26 is the outmost layer of the concentric circle. Please refer to FIG. 8. The silicon oxide liner 26 extends from the trench 24 to the topmost surface of the inter-metal dielectrics 20, and part of the copper dual damascene structure 22 is embedded within the silicon oxide liner 26. For example, the via 22a of the copper dual damascene structure 22 is embedded within the silicon oxide liner 26. Moreover, numerous copper dual damascene structures 22 are embedded in the inter-metal dielectrics 20. Furthermore, a semiconductive substrate 10 is disposed below the inter-metal dielectrics 20. The transistor 14 is disposed on the semiconductive substrate 10. The transistor 14 does not contact all the inter-metal dielectrics 20. A first silicon nitride layer 34 covers the copper material layer 32 and the second electrode layer 28b. Please refer to FIG. 2. The sidewall of the trench 24 of the MIM capacitor structure 100 is uneven. In details, the inter-metal dielectrics 20 include a dielectric layer 20a and a stop layer 20b stacked alternately. The end of the stop layer 20b protrudes from the end of the dielectric layer 20a.

According to the present invention, a silicon oxide liner 26 formed by the flowable chemical vapor deposition FCVE fill up the unevenness on the sidewall of the trench 24. In this way, the first electrode layer 28a, the capacitor dielectric layer 30 and the second electrode layer 28b deposited on the trench 24 can be formed as continuous material layers. The first electrode layer 28a, the capacitor dielectric layer 30 and the second electrode layer 28b will not break because of the uneven sidewall of the trench 24.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a metal-insulator-metal (MIM) capacitor structure, comprising:
providing a plurality of inter-metal dielectrics;
forming a trench embedded within the plurality of inter-metal dielectrics;

performing a flowable chemical vapor deposition to form a silicon oxide liner covering and contacting the trench and covering and contacting a topmost surface of the plurality of inter-metal dielectrics; and forming a first electrode layer, a capacitor dielectric layer, a second electrode layer and a copper material layer filling into the trench, wherein the plurality of inter-metal dielectrics comprise a dielectric layer and a stop layer stacked alternately, and wherein along a sidewall of the trench, an end of the stop layer protrudes from an end of the dielectric layer.

2. The fabricating method of an MIM capacitor structure of claim 1, wherein an operating temperature of the flowable chemical vapor deposition is between 150 degrees Celsius and 200 degrees Celsius.

3. The fabricating method of an MIM capacitor structure of claim 1, wherein part of a copper dual damascene structure is embedded within the silicon oxide liner.

4. The fabricating method of an MIM capacitor structure of claim 1, further comprising a plurality of copper dual damascene structures embedded within the plurality of inter-metal dielectrics.

* * * * *